United States Patent
Zhou (10) Patent No.: US 12,016,192 B2
(45) Date of Patent: Jun. 18, 2024

(54) CONDUCTIVE FILM, ORGANIC ELECTROLUMINESCENCE DEVICE, DISPLAY DEVICE AND METHOD

(71) Applicant: BOE Technology Group Co., Ltd., Beijing (CN)

(72) Inventor: Hui Zhou, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 347 days.

(21) Appl. No.: 17/627,091

(22) PCT Filed: Apr. 29, 2021

(86) PCT No.: PCT/CN2021/090924
§ 371 (c)(1),
(2) Date: Jan. 13, 2022

(87) PCT Pub. No.: WO2022/226878
PCT Pub. Date: Nov. 3, 2022

(65) Prior Publication Data
US 2023/0320125 A1 Oct. 5, 2023

(51) Int. Cl.
*H01L 51/50* (2006.01)
*H10K 50/19* (2023.01)
*H10K 50/822* (2023.01)
*H10K 50/828* (2023.01)
*H10K 71/60* (2023.01)

(52) U.S. Cl.
CPC .......... *H10K 50/828* (2023.02); *H10K 50/19* (2023.02); *H10K 50/822* (2023.02); *H10K 71/611* (2023.02)

(58) Field of Classification Search
CPC .......... H10K 50/828; H10K 50/822
See application file for complete search history.

(56) References Cited

U.S. PATENT DOCUMENTS

| | | |
|---|---|---|
| 2005/0081907 A1 | 4/2005 | Lewis et al. |
| 2010/0051902 A1 | 3/2010 | Hiura et al. |
| 2017/0301880 A1 | 10/2017 | Pei et al. |

FOREIGN PATENT DOCUMENTS

| | | |
|---|---|---|
| CN | 1610132 A | 4/2005 |
| CN | 103413950 A | 11/2013 |
| CN | 103865220 A | 6/2014 |
| CN | 104681726 A | 6/2015 |
| CN | 104993066 A | 10/2015 |
| CN | 109252183 A | 1/2019 |
| CN | 110228798 A | 9/2019 |
| CN | 111446378 A | 7/2020 |

(Continued)

OTHER PUBLICATIONS

Li, Tao, et al. "A two-dimensional semiconducting covalent organic framework with nickel (II) coordination for high capacitive performance." Journal of Materials Chemistry A 7.34 (2019): 19676-19681.

(Continued)

*Primary Examiner* — Anthony Ho
(74) *Attorney, Agent, or Firm* — IPro, PLLC (57) ABSTRACT

The present disclosure provides a conductive film, an organic electroluminescence device, a display device and a method. The conductive film includes a matrix and conductive metal nano-ions distributed in the matrix the matrix is selected from at least one of an organic network polymer, an organic porous polymer, and an inorganic porous material.

18 Claims, 7 Drawing Sheets

(56) References Cited

FOREIGN PATENT DOCUMENTS

JP        2008111941 A    5/2008
WO       2014089708 A1    6/2014

OTHER PUBLICATIONS

Li, Yunfei. "Metal Nanostructures Based Composite Materials for Organic Light-Emitting Device Application" Doctoral thesis, Jilin University, Jun. 3, 2018.

Xu, Guoyuan, et al. "Progress in preparation of metal nanoparticles coated by polymer." Functional Materials, vol. 12 (2016): 12029-12037. DOI: 10.3969/j.issn.1001-9731.2016.12.006.

Jin, Zhiwen, et al. "Solution-processed transparent coordination polymer electrode for photovoltaic solar cells." Nano Energy 40 (2017): 376-381.

CONDUCTIVE FILM, ORGANIC ELECTROLUMINESCENCE DEVICE, DISPLAY DEVICE AND METHOD

CROSS-REFERENCE TO RELATED APPLICATION

This application is the U.S. national phase of PCT Application No. PCT/CN2021/090924 filed on Apr. 29, 2021, the disclosures of which are incorporated in their entirety by reference herein.

TECHNICAL FIELD

The present disclosure relates to the field of display technology, in particular, to a conductive film, an organic electroluminescence device, a display device and a method.

BACKGROUND

At present, in the production process of active-matrix organic light emitting diode (AMOLED) products, in order to achieve the purpose of accurately controlling the pixel switch, a top-emitting device structure is adopted, that is to say, a microcavity is formed between the anode and the cathode. Thus, the anode is required to be of total reflection, and the cathode is preferably a transparent cathode. The current method for preparing transparent oxide electrodes generally requires the use of magnetron sputtering, but this method will cause high-temperature cracking and high-energy ion damage of the bottom evaporation material due to the high energy and high temperature in the sputtering. In view of this, a high-temperature thermal vapor deposition metal composite film scheme (Mg/Ag alloy) is used to achieve higher transmittance and lower resistance.

Although the metal composite film can meet the demand for mass production, it is necessary to further increase the transmittance of the cathode of the device in order to further increase the transmittance of the cathode and the light extraction rate inside the device. The transmittance of the metal composite film has basically reached its limit under the premise of meeting the resistance requirements, it is urgent to develop new cathode materials to meet higher product demand.

SUMMARY

A purpose of the technical solution of the present disclosure is to provide a conductive film, an organic electroluminescence device, a display device and a method for preparing the same, which are used to solve the problem that the cathode material in the prior art cannot meet the requirements of the transmittance and the lower resistance of the cathode.

An embodiment of the present disclosure provides a conductive film, including a matrix and conductive metal nano-ions distributed in the matrix, in which the matrix is selected from at least one of an organic network polymer, an organic porous polymer, and an inorganic porous material.

Optionally, the matrix in which the conductive metal nano-ions are distributed have a specific surface area greater than 150 $m^2/g$.

Optionally, the matrix is an organic network polymer or an organic porous polymer, and the matrix and the conductive metal nano-ion are chelatedly connected through a coordination bond; or the matrix is an inorganic porous material, and the matrix and the conductive metal nano-ions are coordinately connected through intermolecular force.

Optionally, the conductive metal nano-ions are uniformly distributed in the matrix, and have a distribution ratio in a range from 1% to 70%.

Optionally, the conductive metal nano-ions include at least one of Ag, Mg, Cu, Au, and Al.

Optionally, the organic network polymer and the organic porous polymer independently include a covalent organic framework material.

An embodiment of the present disclosure provides an organic electroluminescence device, including an anode and a light emitting function layer, in which the organic electroluminescence device further includes the conductive film as described above, the conductive film is formed as a cathode arranged opposite to the anode, and the light emitting function layer is located between the conductive film and the anode.

Optionally, the matrix has a thickness in a range from 30 nm to 50 nm.

Optionally, the conductive metal nano-ions distributed in the matrix include Ag and/or Mg, and the matrix has a thickness in a range from 40 nm to 50 nm.

Optionally, the conductive film has a transmittance to red light in a range from 63% to 69%, a transmittance to green light in a range from 67% to 73%, and a transmittance to blue light in a range from 73% to 77%.

Optionally, the light emitting function layer includes an electron transport layer, the conductive film is connected to the electron transport layer, and the electron transport layer is prepared from an aromatic compound having a nitrogen-heterocyclic electron withdrawing group.

Optionally, the light emitting function layer includes a first light emitting unit for emitting red light, a second light emitting unit for emitting green light, and a third light emitting unit for emitting blue light, in which a distance between a first film portion of the conductive film corresponding to the first light emitting unit and the anode is greater than a distance between a second film portion of the conductive film corresponding to the second light emitting unit and the anode; and a distance between a second film portion of the conductive film corresponding to the second light emitting unit and the anode is greater than a distance between a third film portion of the conductive film corresponding to the third light emitting unit and the anode.

Optionally, the conductive film is prepared by an evaporation process or a spin coating process.

An embodiment of the present disclosure further provides a display device, including the organic electroluminescence device as described above.

An embodiment of the present disclosure provides a method for preparing an electrode material, including: providing conductive metal nano-ions and a monomer material; and preparing an electrode material including a matrix and conductive metal nano-ions distributed in the matrix using the monomer material and the conductive metal nano-ions, in which the matrix is selected from at least one of an organic network polymer, an organic porous polymer, and an inorganic porous material.

Optionally, the monomer material is an organic monomer, and the preparing the electrode material including the matrix and the conductive metal nano-ions distributed in the matrix includes: making the organic monomer polymerize into an organic network polymer; and chelating the conductive metal nano-ions with an organic network polymer having a preset temperature to prepare the electrode material.

Optionally, the chelating the conductive metal nano-ions with the organic network polymer having the preset temperature to prepare the electrode material includes: placing the organic network polymer in a preset solvent; adding the conductive metal nano-ions after the preset solvent is heated to a preset temperature, to chelate the conductive metal nano-ions with the organic network polymer in the preset solvent; and filtering the preset solvent, and vacuum drying the electrode material obtained by filtering the preset solvent, to obtain the electrode material.

Optionally, the monomer material is an organic monomer, and the preparing the electrode material including the matrix and the conductive metal nano-ions distributed in the matrix includes: chelating the conductive metal nano-ions with the organic monomer to obtain a chelated metal; and placing the chelated metal in a preset solvent, and polymerizing the organic monomer in the chelated metal to form an organic network polymer, to obtain the electrode material.

Optionally, after placing the chelated metal in the preset solvent, and polymerizing the organic monomer in the chelated metal to form the organic network polymer, the method further includes: filtering the preset solvent, and vacuum drying the electrode material obtained by filtering the preset solvent.

BRIEF DESCRIPTION OF THE DRAWINGS

In order to illustrate the technical solutions of the present disclosure or the related technology in a clearer manner, the drawings desired for the present disclosure will be briefly hereinafter briefly. Obviously, the following drawings merely relate to some embodiments of the present disclosure. Based on these drawings, a person skilled in the art may obtain the other drawings without any creative effort.

DETAILED DESCRIPTION

The technical problems, the technical solutions, and the advantages of the present invention will be more clearly described in combination with the drawings and specific embodiments.

In order to solve the problem that the cathode material in the prior art cannot meet the requirements of the transmittance and lower resistance of the cathode, an embodiment of the present disclosure provide a conductive film prepared from conductive metal nano-ions and at least one of an organic network polymer, an organic porous polymer and an inorganic porous material, and the conductive film can be used as a cathode of an organic electroluminescence device, which is capable of achieving the effect of increasing the transmittance of the cathode as compared with a cathode prepared from Mg/Ag alloy. In addition, the doped conductive metal nano-ions can further achieve the effect of reducing the resistance of the cathode.

Optionally, an embodiment of the present disclosure provides a conductive film, including a matrix and conductive metal nano-ions distributed in the matrix, in which the matrix is selected from at least one of an organic network polymer, an organic porous polymer, and an inorganic porous material.

In an embodiment of the present disclosure, the matrix is an organic network polymer or an organic porous polymer, and the matrix and the conductive metal nano-ion are chelatedly connected through a coordination bond; or the matrix is an inorganic porous material, and the matrix and the conductive metal nano-ions are coordinately connected through intermolecular force, e.g., van der waals force.

In an embodiment, when the matrix is an organic network polymer or an organic porous polymer, the organic material is synthesized into an organic polymer material by a conventional solution preparation method, has metal bonding sites and nano-scale pores using the network structure and organic porous structure of organic polymer material, and is combined and bonded with conductive metal through high temperature solution method, thereby obtaining an organic metal composite material. That is, the conductive film according to the embodiment of the present disclosure is prepared. The conductive film is capable of being used into preparing a cathode of the organic electroluminescence device, thereby solving the problem that the cathode material in the prior art cannot meet the requirements of the transmittance and the lower resistance of the cathode.

Optionally, the conductive metal nano-ions include at least one of Ag, Mg, Cu, Au, and Al.

Optionally, the matrix in which the conductive metal nano-ions are distributed have a specific surface area at least greater than 150 m$^2$/g.

In the embodiment of the present disclosure, optionally, the specific area of the matrix before the metal nano-ion is loaded may be up to 625 m$^2$/g, and the specific surface area is slightly reduced and may be up to 410 m²/g after the metal nano-ion is loaded, and the pore volume is 0.46 cm³/g.

Optionally, the conductive metal nano-ions are uniformly distributed in the matrix, and have a distribution ratio in a range from 1% to 70%.

Figure 1:
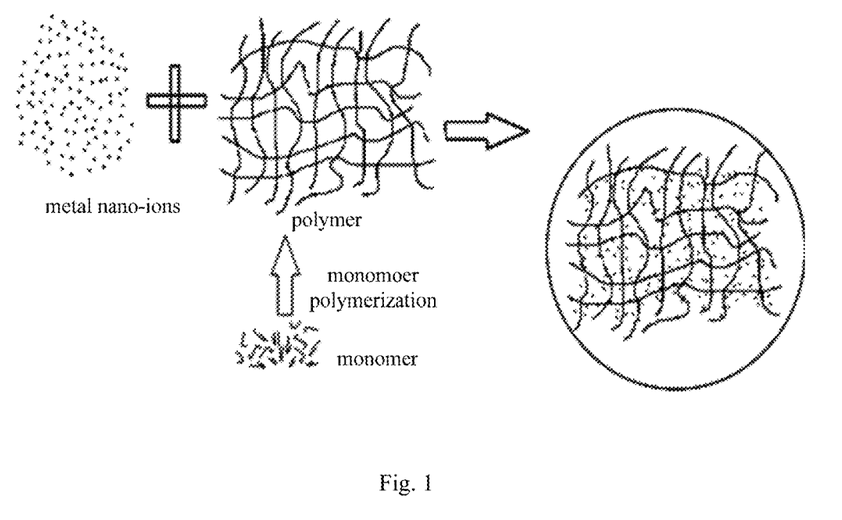
FIG. 1 is a schematic view showing a process for preparing an electrode material according to an embodiment of the present disclosure.

In an embodiment, optionally, a method for preparing an electrode material from a conductive film, as shown in FIG. 1, includes: making an organic monomer polymerize into an organic network polymer by a solution preparation method; and chelating the conductive metal nano-ions with an organic network polymer having a preset temperature to prepare the electrode material.

Optionally, the chelating the conductive metal nano-ions with the organic network polymer having the preset temperature to prepare the electrode material includes: placing the organic network polymer in a preset solvent; adding the conductive metal nano-ions after the preset solvent is heated to a preset temperature, to chelate the conductive metal nano-ions with the organic network polymer in the preset solvent; and filtering the preset solvent, to obtain the electrode material.

In the above embodiments, optionally, the organic monomer is selected from a substance or material containing nitrogen or oxygen that may chelates metal ions, for example, a carbazole-based substance or a thiophene-based substance can be selected as the organic monomer.

The organic monomers of the above materials can be polymerized into organic network polymers by the solution preparation method, as shown in FIG. 1.

Optionally, in order to avoid excessively high molecular weight of the organic network polymer generated, a solvent with moderate polarity can be used, that is, the preset solvent is a solvent with moderate polarity. The preset solvent is heated to a preset temperature to cause a reaction at a high temperature between the conductive metal nano-ions and the organic network polymer in the preset solvent. The conductive metal nano-ions and the organic network polymer are chelated in the preset solvent, the preset solvent is filtered, and the obtained material is vacuum dried to remove the adsorption solvent, to obtain the electrode material.

Optionally, the preset can be selected from at least one of dimethyl sulfoxide, dimethyl formamide, chloroform, toluene, isopropanol, and acetonitrile.

In the above method, in the prepared electrode material, the doping ratio of conductive metal nano-ions in the organic network polymer is in a range from 1% to 25%. Since the selection of the organic polymer and the conductive metal nano-ions has a greater influence on the doping ratio, the selection of different organic polymers and conductive metal nano-ions can adjusting the doping ratio of the conductive metal nano-ions in the organic network polymer to be in a range from 1% to 25%.

Figure 2:
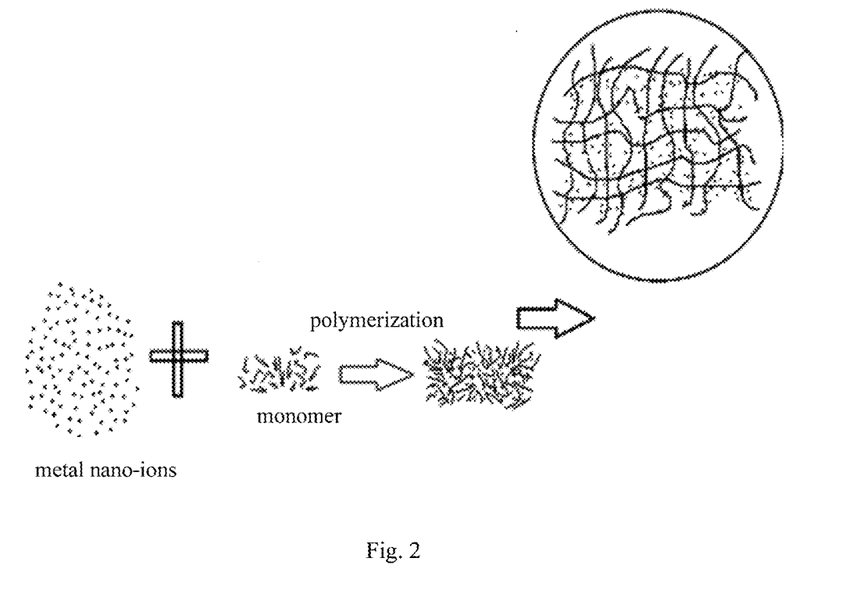
FIG. 2 is a schematic view showing a process for preparing an electrode material according to another embodiment of the present disclosure.

In another embodiment of the present disclosure, optionally, a method for preparing an electrode material from a conductive film, as shown in FIG. 2, includes: chelating the conductive metal nano-ions with the organic monomer to obtain a chelated metal; and placing the chelated metal in a preset solvent, and polymerizing the organic monomer in the chelated metal to form an organic network polymer, to obtain the electrode material.

Optionally, the conductive metal nano-ions can be chelated with the organic monomer by a solvothermal process to obtain a chelated metal. On this basis, a suitable preset solvent is selected to polymerize the metal chelating monomer to form an organic network polymer, and then the preset solvent is filtered, and the electrode material obtained by filtering the preset solvent is vacuum dried, to obtain the electrode material for preparing the cathode.

Optionally, the preset solvent is required to have good solubility, that is, it can well dissolve a monomer, e.g., at least one of dimethyl sulfoxide (DMSO), N,N-dimethylformamide (DMF), isopropanol, and other solvents with large polarity.

The polymerization is performed by a solvothermal process, that is, a high molecular polymer polymerization is performed in an ampoule filled with inert gas, to obtain a polymer, followed by loading with a nano-ion.

In this embodiment, the chelation between specifically selected organic monomers and conductive metal nano-ions can obtain a larger doping ratio of conductive metal nano-ions as compared with the first embodiment, so that the doping ratio of the conductive metal nano-ions in the organic network polymer is in a range from 20% to 70%.

In the above embodiments of the present disclosure, taking the matrix of the electrode material as an organic network polymer as an example, the method for preparing the electrode material is exemplified. Similarly, through the chelating between the coordination bonds, an electrode material including organic porous polymers and conductive metal nano-ions can also be prepared.

In the embodiments of the present disclosure, optionally, the organic network polymer and the organic porous polymer each include a covalent organic framework (COF) material.

It should be noted that, because the metal chelation will affect the polymerization molecular weight of the monomer, the electrode material can be prepared according to the embodiment of the present disclosure as the shown in FIG. 1 in the case that the selected organic monomer has a large molecular weight; and the electrode material can be prepared according to the embodiment of the present disclosure as the shown in FIG. 2 in the case that the selected organic monomer has a small molecular weight.

It should be noted that a large molecular weight generally refers to a molecular weight greater than 10,000 and less than 20,000; and a small molecular weight generally refers to a molecule greater than 5,000 and less than 8,000.

In the embodiments of the present disclosure, the conductive metal nano-ions that are combined with organic monomers to form the electrode material can be selected from at least one of Ag, Mg, Cu, Au, and Al. Specifically, one of or a mixture of at least two mixed materials of the nano-ions can be selected.

It should be noted that in the conductive film according to the embodiments of the present disclosure, the matrix carrying the conductive metal nano-ions is not limited to the above organic network polymers or organic porous polymers, for example, it can also be organic network polymers, organic porous polymers of bone-like structures, etc., or may also be inorganic porous materials. For example, they may be graphene materials.

In the conductive film according to this embodiment, the matrix of the conductive film prepared by polymerizing as organic network polymer, organic porous polymer or inorganic porous material with the conductive metal nano-ions, utilizes the characteristics of the network or the porous material of the matrix, and is capable of achieving the effect of increasing the transmittance of the cathode as compared with the cathode made of the common Mg/Ag alloy. In addition, the doped conductive metal nano-ions can further achieve the effect of reducing the resistance of the cathode.

Figure 13:
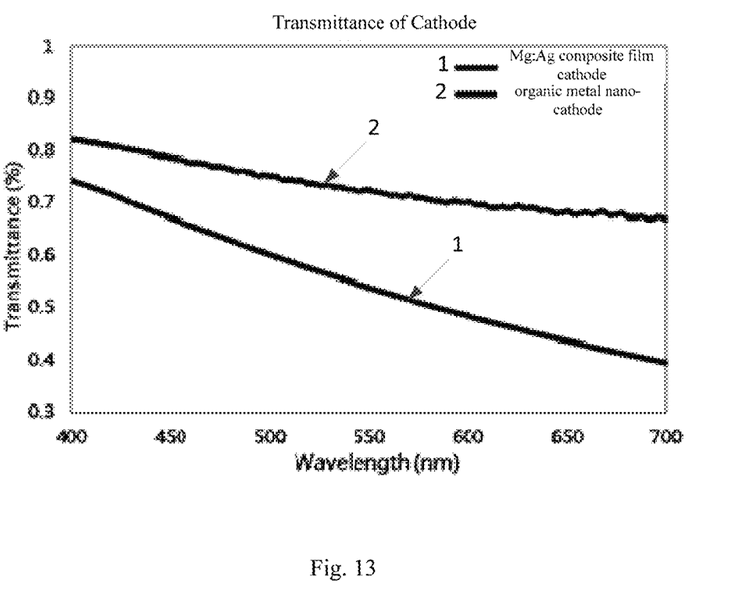
FIG. 13 is a diagram showing a comparison in transmittance between a cathode prepared from the conductive film according to an embodiment of the present disclosure and a cathode of a conventional material.

As shown in FIG. 13, the transmittance of the conductive film according to the embodiment of the present disclosure is compared with the cathode of the metal composite film structure made of common Mg/Ag alloy. The conductive film having the structure according to the embodiment of the present disclosure has obvious advantages in light transmittance, and in reducing the absorption of light in the long wavelength direction.

In other aspect, an embodiment of the present disclosure also provides an organic electroluminescence device, including an anode and a light emitting function layer, and further including the conductive film as described above embodiments, in which the conductive film is formed as a cathode arranged opposite to the anode, and the light emitting function layer is located between the conductive film and the anode.

In the organic electroluminescence device according to the embodiment of the present disclosure, the cathode formed from the conductive film according to the embodiment of the present disclosure is capable of achieving the effect of increasing the transmittance of the cathode as compared with the cathode made of common Mg/Ag alloy, and the doped conductive metal nano-ions is capable of further achieving the effect of reducing the resistance of the cathode, thereby solving the problem that the cathode material in the prior art cannot meet the requirements of the transmittance and the lower resistance of the cathode.

Figure 3:
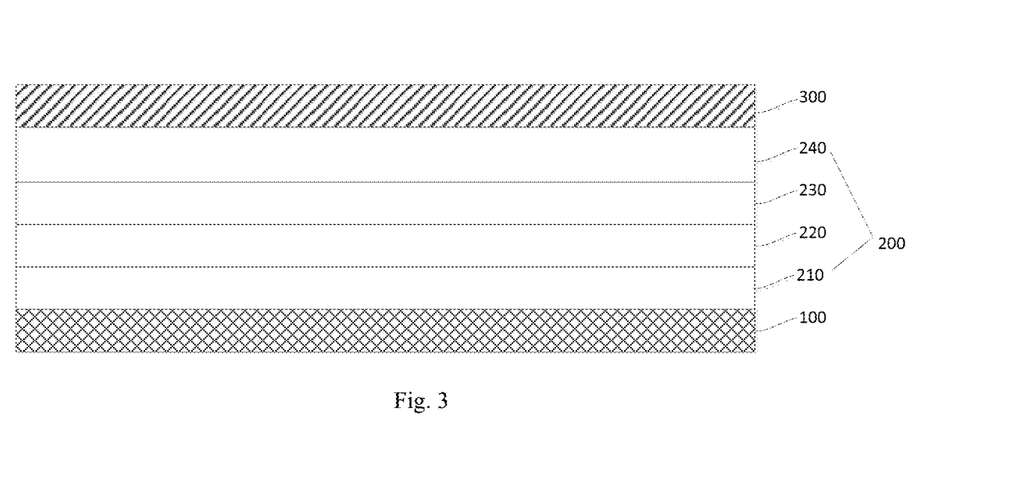
FIG. 3 is a schematic view showing a cross section of an electroluminescence device according to an embodiment of the present disclosure.

FIG. 3 is a schematic view showing a cross section of an electroluminescence device according to an embodiment of the present disclosure. The organic electroluminescence device includes an anode 100, a light emitting function layer 200, and a cathode 300 arranged in sequence. The cathode 300 is also the conductive film according to the above embodiment of the present disclosure.

Specifically, the conductive film includes a matrix and conductive metal nano-ions distributed in the matrix the matrix is selected from at least one of an organic network polymer, an organic porous polymer, and an inorganic porous material.

In the conductive film prepared as the cathode 300 according to embodiment of the present disclosure, the matrix has a thickness in a range from 30 nm to 50 nm.

The following table shows the comparison parameters of the surface resistance between the cathode made of the conventional Mg/Ag alloy metal composite film and the conductive film according to the embodiment of the present disclosure, that is, the organic metal nano-film.

|  | Metal Composite Film | Organic Metal Nano-film | | | | |
| --- | --- | --- | --- | --- | --- | --- |
| Thickness | 130 Å | 300 Å | 350 Å | 380 Å | 420 Å | 460 Å |
| Surface Resistance (Ω/sq.) | 8.2 | 30.6 | 26.5 | 19.7 | 13.9 | 9.1 |

Since the transmittance and the resistance of the conductive film vary with its thickness, considering the influence on the transmittance and the resistance, optionally, when the conductive metal nano-ions in the matrix include Ag and/or Mg, the thickness of the matrix is in a range from 40 nm to 50 nm.

In addition, in the organic electroluminescence device, as shown in FIG. 3, in the direction from the anode 100 to the cathode 300, the light emitting function layer 200 includes: a hole injection layer 210, a hole transport layer 220, a light emitting layer 230, and an electron transport layer 240 in sequence. The cathode 300 (that is, the conductive film) is connected to the electron transport layer 240. Optionally, the electron transport layer 240 is prepared from an aromatic compound having a nitrogen-heterocyclic electron withdrawing group.

Optionally, when the organic electroluminescence device is prepared, an open mask is used to sequentially vapor deposit the hole injection layer 210 and the hole transport layer 22 on the base substrate for forming the anode 100, the light emitting layer 230 is formed by FMM vapor deposition, and then the electron transport layer 240 is formed by the open mask vapor deposition.

Figure 4:
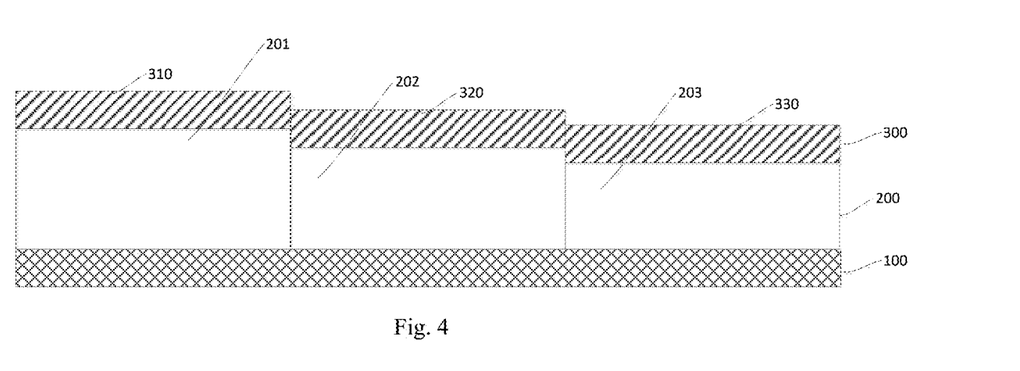
FIG. 4 is a schematic view showing a cross section of an electroluminescence device according to another embodiment of the present disclosure.

Optionally, referring to FIG. 4, in the organic electroluminescence device, the light emitting function layer 200 includes: a first light emitting unit 201 for emitting red light, a second light emitting unit 202 for emitting green light, and a third light emitting unit 203 emitting blue light. A distance between a first film portion 310 of the conductive film (i.e., the cathode 300) corresponding to the first light emitting unit 201 and the anode 100 is greater than a distance between a second film portion 320 of the conductive film corresponding to the second light emitting unit 202 and the anode 100; and a distance between a second film portion 320 of the conductive film corresponding to the second light emitting unit 202 and the anode 100 is greater than a distance between a third film portion 330 of the conductive film corresponding to the third light emitting unit 203 and the anode 100.

Based on this embodiment, the hole injection layer 210, the hole transport layer 220, the electron transport layer 240, and the cathode 300 corresponding to different light emitting units are common layers of the plurality of the light emitting units. These layers can be prepared in a same process. Corresponding to the light emitting layers 230 of different light emitting units, the light emitting layers 230 of the same color can be prepared by a same vapor deposition process, and the light emitting layers 230 of different colors can be prepared by different vapor deposition processes.

Optionally, in the embodiment of the present disclosure, the conductive film (i.e., the cathode 300) is prepared by vapor deposition or spin coating.

Figure 14:
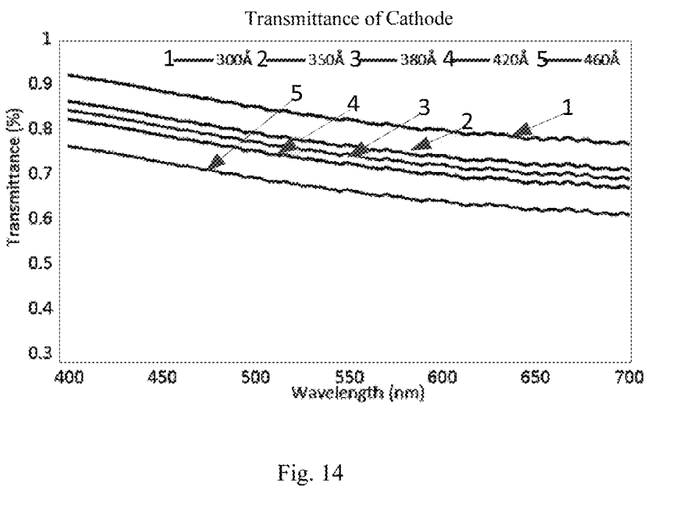
FIG. 14 is a diagram showing a comparison in transmittance among a cathode prepared from the conductive film according to an embodiment of the present disclosure for beams of different wavelengths.

In the embodiments of the present disclosure, as shown in FIG. 14, when the conductive film having the structure according to above embodiment prepared by the spin coating method is a cathode, the transmittances to light of different wavelengths are shown.

Optionally, the conductive film, i.e., the cathode 300, is a light transmitting layer, the transmittance to red light is in a range from 63% to 69%, the transmittance to green light is in a range from 67% to 73%, and the transmittance of blue light is in a range from 73% to 77%.

In other aspect, an embodiment of the present disclosure also provides a display device including the organic electroluminescence device according to the above embodiments.

Figure 5:
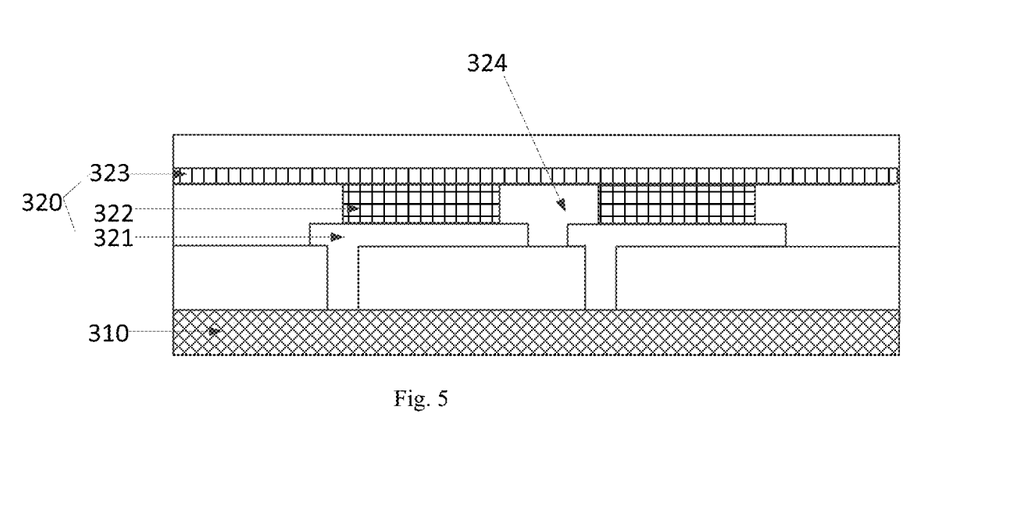
FIG. 5 is a schematic view showing a structure of a display device according to an embodiment of the present disclosure.

FIG. 5 is a schematic view showing a cross-sectional structure of a display device according to an embodiment of the present disclosure. The display device according to this embodiment includes: an array substrate 310 and a plurality of light emitting units 320 prepared on the array substrate, and the plurality of light emitting units are configured to be organic electroluminescence devices.

Each light emitting unit 320 includes: a first electrode 321, a light emitting function layer 322 arranged on a surface of the first electrode 321 away from the array substrate 310, and a second electrode 323 arranged on a surface of the light emitting function layer 322 away from the first electrode 321.

Optionally, the light emitting unit further includes a pixel defining layer 324 arranged on the first electrode 321, and the light emitting function layer 322 is arranged in the pixel defining layer 324.

The first electrode 321 is connected to the source/drain layer of the array substrate 310 through via holes, and a driving voltage is input to the first electrode 321 through the driving circuit on the array substrate 310, and the voltage difference between the first electrode 321 and the second electrode 323 is capable of driving the light emitting function layer 322 to emit light.

In the embodiment of the present disclosure, optionally, the first electrode 321 is an anode, and the second electrode 323 is a cathode. The light emitting function layer 322 includes: a hole injection layer, a hole transport layer, a light emitting function layer, an electron transport layer, and an electron injection layer that are sequentially arranged.

In the display device according to the embodiment, the cathode is formed into the conductive film having the structure of the above embodiment, including the matrix and the conductive metal nano-ions distributed in the matrix, and the matrix is at least one of an organic network polymer, an organic porous polymer, and an inorganic porous material. The display device is capable of achieving the effect of increasing the transmittance of the cathode as compared with the cathode made of common Mg/Ag alloy, and the doped conductive metal nano-ions is capable of further achieving the effect of reducing the resistance of the cathode, thereby solving the problem that the cathode material in the prior art cannot meet the requirements of the transmittance and the lower resistance of the cathode.

It should be noted that the specific structure of the above display device is only an example, and the specific structure is not limited thereto.

In other aspect, an embodiment of the present disclosure further provides a method for preparing a cathode of an organic electroluminescence device prepared from an electrode material, the electrode material includes a matrix and conductive metal nano-ions distributed in the matrix; and the matrix is at least one of an organic network polymer, an organic porous polymer, and an inorganic porous material, and the method includes: preparing a cathode on a substrate to be prepared into the cathode by vapor depositing the electrode material; or preparing the cathode by spin-coating the electrode material onto the substrate to be prepared into the cathode.

Figure 6:
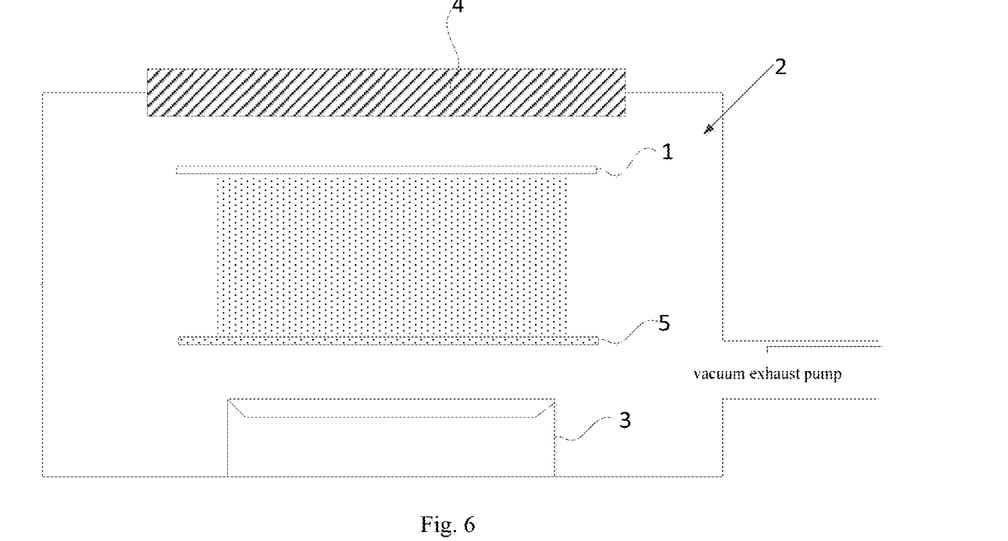
FIG. 6 is a schematic view showing a process for preparing a cathode from an electrode material according to an embodiment of the present disclosure.

In an the embodiment, optionally, as shown in FIG. 6, when the cathode of the organic electroluminescence device is prepared, the substrate 1 to be prepared into the cathode is placed in a vacuum chamber 2, the vacuum chamber 2 is also provided with a vapor deposition crucible 3, the vapor deposition crucible 3 contains the electrode material according to the embodiment of the present disclosure, the electrode material in the vapor deposition crucible 3 is heated by the heating source 4 to evaporate the electrode material to passes through the mask 5, and the evaporated electrode material is deposited on the substrate 1 to be prepared into the cathode, so that the desired pattern is formed on the substrate 1 to form the cathode.

In the method according to the embodiment, it is capable of effectively improving the transmittance of the cathode as compared with the cathode in a form of a metal composite film structure made of Mg/Ag alloy, reducing the Rs resistance of the cathode as the metal chelation ratio in the electrode material increases, and ensuring the film formation better than the film formation of metal.

Optionally, in the embodiments of the present disclosure, the conductive metal nano-ions in the electrode material include bimetals or polymetals to reduce the electron injection barrier.

The method according to the embodiment of the present disclosure, in another embodiment, prepares a cathode by spin-coating the electrode material on a substrate to be prepared into the cathode.

Figure 7:
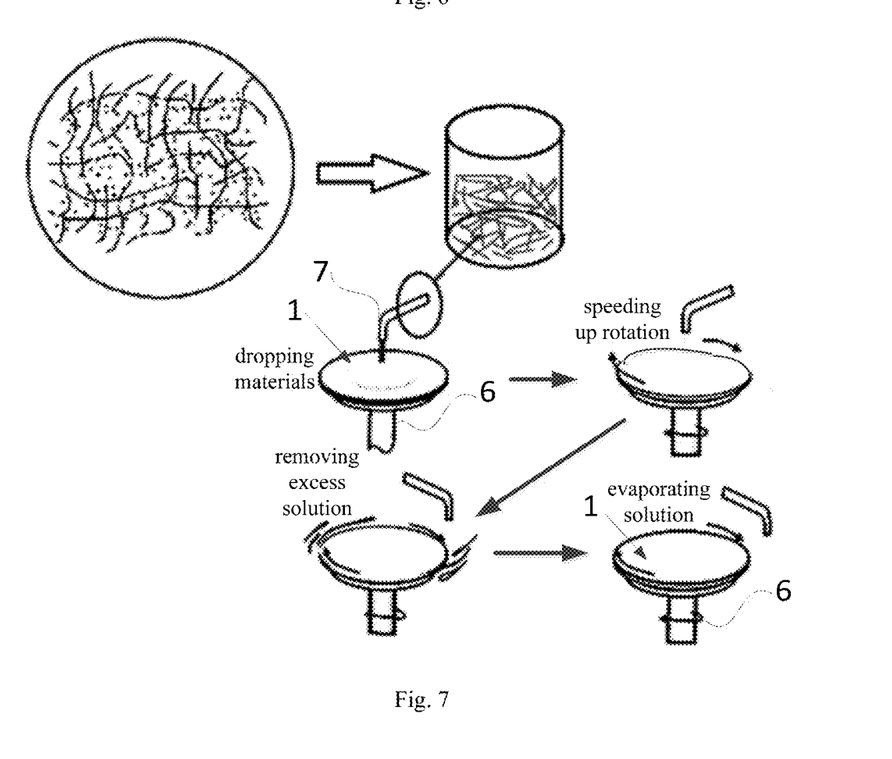
FIG. 7 is a schematic view showing a process for preparing a cathode from an electrode material according to another embodiment of the present disclosure.

As shown in FIG. 7, in this embodiment, the substrate 1 to be prepared into a cathode is arranged on a rotatable base 6, and an outlet tube 7 of the electrode material is arranged above the base 6; and the electrode material is capable of being input to the substrate 1 located on the base 6 through the outlet tube 7. The electrode material is deposited on the substrate 1 through a high-speed rotation of the base 6 to uniformly form a film, the excess solution of the electrode material deposited on the substrate 1 is removed through the rotation of the base 6, and the desired cathode is finally prepared on the substrate 1 through further volatilizing the solvent on the substrate 1.

This embodiment is particularly suitable for the spin coating of the entire surface of the cathode on a large-size panel, and has the effect of shortening the mass production time and increasing the productivity.

Figure 8A:
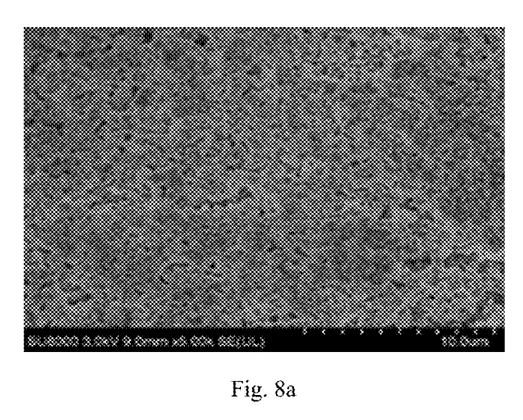
FIGS. 8a and 8b are schematic views showing an SEM spectrum of an electrode material according to an embodiment of the present disclosure.
Figure 8B:
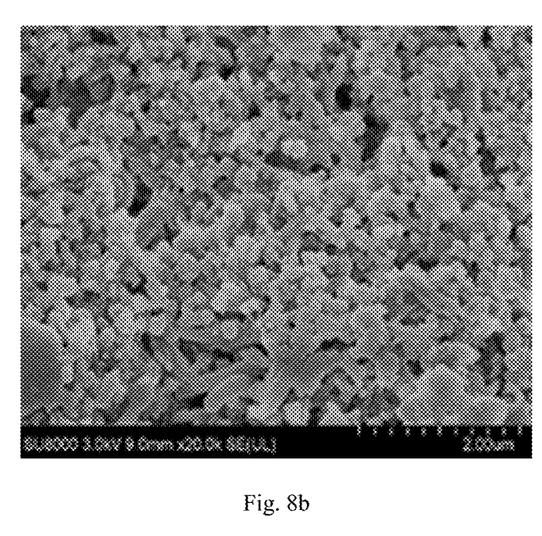
Figure 9:
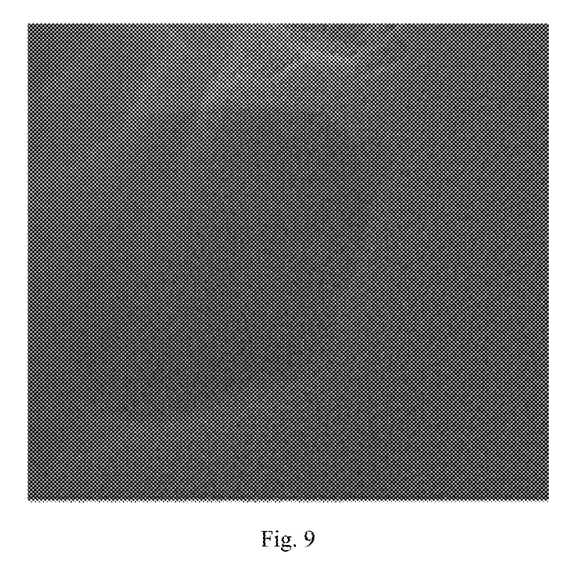
FIG. 9 is a schematic view showing a TEM spectrum of an electrode material according to an embodiment of the present disclosure.

In the display device according to the embodiment of the present disclosure, by analyzing the SEM spectra of the electrode material, as shown in FIGS. 8a and 8b, and by observing the surface topography of the material, the cross-linked characteristics of the material can be observed. In addition, according to the TEM spectrum observation of the prepared material shown in FIG. 9, a very obvious pore structure can be observed, and this pore structure can ensure the best light transmission effect of the cathode.

Figure 10:
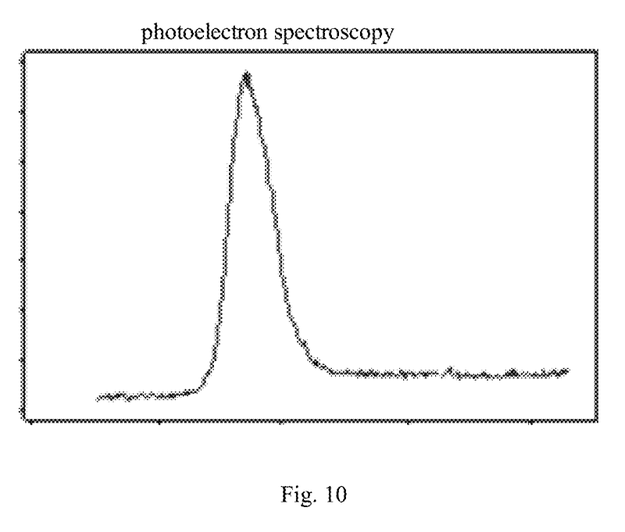
FIG. 10 is a schematic view showing a photoelectron spectrum of an electrode material according to an embodiment of the present disclosure.

Furthermore, taking the conductive metal nano-ions including Ag as an example, when the prepared electrode material is subjected to photoelectron spectroscopy analysis, as shown in FIG. 10, the characteristic peak of Ag is near 368 eV. As can be seen, the electrode material has chelated nano Ag, so that the chelated nano Ag can further achieve the effect of reducing the resistance of the cathode.

Figure 11:
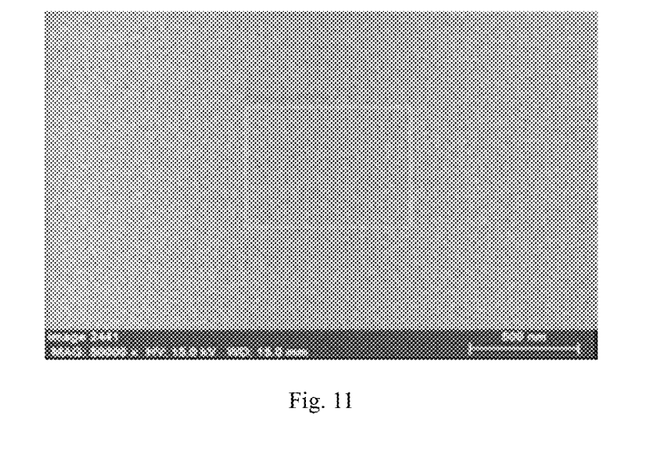
FIG. 11 is a schematic view showing an SEM spectrum of the prepared cathode.

In addition, in the above electrode material, when the cathode is prepared by evaporation, the SEM spectrum of the single-layer film of the prepared cathode is shown in FIG. 11. It can be seen that a dense film is formed after the material is evaporated. As proved by experiments, the surface resistance of the formed cathode is less than 10 ohms, and the transmittance can be greater than or equal to 70%. As compared with the prior art, it is capable of solving the problem that the cathode material cannot meet the requirements of higher transmittance and lower resistance.

Figure 12:
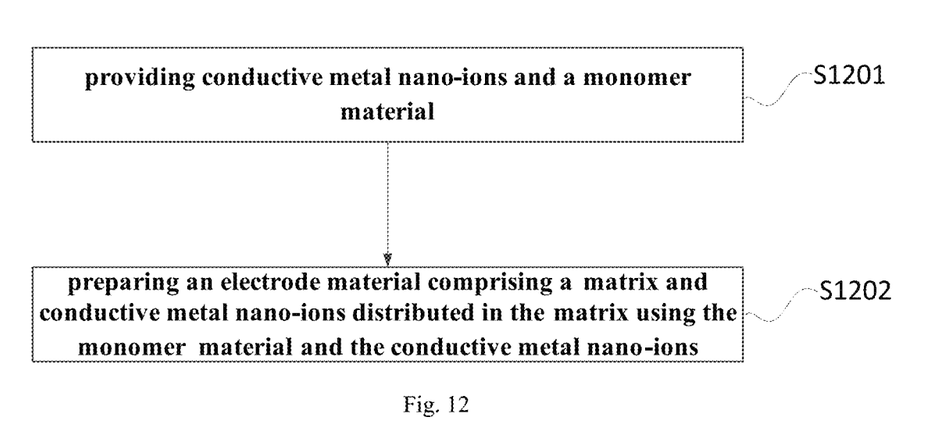
FIG. 12 is a schematic view showing a flow process for preparing an electrode material according to an embodiment of the present disclosure.

In another aspect, an embodiment of the present disclosure provides a method for preparing an electrode material, as shown in FIG. 12, including: S1201, providing conductive metal nano-ions and monomer materials; and S1202, preparing an electrode material including a matrix and conductive metal nano-ions distributed in the matrix using the monomer material and the conductive metal nano-ions, in which the matrix is selected from at least one of an organic network polymer, an organic porous polymer, and an inorganic porous material.

Optionally, in the method according to an embodiment, as shown in FIG. 1, the monomer material is an organic monomer, and in the step S1202, the preparing the electrode material including the matrix and the conductive metal nano-ions distributed in the matrix includes: making the organic monomer polymerize into an organic network polymer; and chelating the conductive metal nano-ions with an organic network polymer having a preset temperature to prepare the electrode material.

Optionally, the organic monomer is selected from a substance or material containing nitrogen or oxygen that chelates metal ions, for example, a carbazole-based substance or a thiophene-based substance can be selected as the organic monomer.

Optionally, in the above method, the chelating the conductive metal nano-ions with the organic network polymer having the preset temperature to prepare the electrode material includes: placing the organic network polymer in a preset solvent; adding the conductive metal nano-ions after the preset solvent is heated to a preset temperature, to chelate the conductive metal nano-ions with the organic network polymer in the preset solvent; and filtering the preset solvent, and vacuum drying the electrode material obtained by filtering the preset solvent, to obtain the electrode material.

Optionally, the preset can be selected from at least one of dimethyl sulfoxide, dimethyl formamide, chloroform, toluene, isopropanol, and acetonitrile.

In another embodiment, the method according to an embodiment of the present disclosure, as shown in FIG. 2, the monomer material is an organic monomer, and in step S1202, the preparing the electrode material including the matrix and the conductive metal nano-ions distributed in the matrix includes: chelating the conductive metal nano-ions with the organic monomer to obtain a chelated metal; and placing the chelated metal in a preset solvent, and polymerizing the organic monomer in the chelated metal to form an organic network polymer, to obtain the electrode material.

Optionally, after placing the chelated metal in the preset solvent, and polymerizing the organic monomer in the chelated metal to form the organic network polymer, the method further includes: filtering the preset solvent, and vacuum drying the electrode material obtained by filtering the preset solvent.

The method for preparing the electrode material according to the embodiment of the present disclosure can be referred to the above detailed description in combination with FIGS. 1 and 2, and, which will not be repeated herein.

In the method according to the embodiment of the present disclosure, organic monomers are formed into polymers of moderate molecular weight by solution preparation, metal nano-ions are bonded with organic materials by chelating methods, and then they are used as cathode evaporation materials. The selection of organic materials, the selection of metal ions and the doping ratio of metal ions can all be adjusted, to achieve the effect of reducing the cathode resistance while increasing the transmittance of the cathode. In the method according to the embodiments of the present disclosure, the electrode material prepared has good film forming properties and conductivity, and has obvious advantages in terms of the transmittance of the film layer as compared with the metal composite film.

The above descriptions are optional embodiments of the present disclosure. It should be noted that a person skilled in the art would make several improvements and substitutions without departing from the principles of the present disclosure. These improvements and modifications should also be regarded as the protection scope of the present disclosure.

What is claimed is:

1. A conductive film, comprising a matrix and conductive metal nano-ions distributed in the matrix, wherein the matrix is at least one selected from a group consisting of an organic network polymer, an organic porous polymer, and an inorganic porous material,
wherein the matrix in which the conductive metal nano-ions are distributed has a specific surface area greater than 150 $m^2/g$, and
wherein the conductive metal nano-ions comprise at least one of Ag, Mg, Au, and Al.

2. The conductive film of claim 1, wherein the matrix is an organic network polymer or an organic porous polymer, and the matrix and the conductive metal nano-ion are chelatedly connected through a coordination bond; or
the matrix is an inorganic porous material, and the matrix and the conductive metal nano-ions are coordinately connected through intermolecular force.

3. The conductive film of claim 1, wherein the conductive metal nano-ions are uniformly distributed in the matrix, and have a distribution ratio in a range from 1% to 70%.

4. The conductive film of claim 1, wherein the organic network polymer and the organic porous polymer independently comprise a covalent organic framework material.

5. An organic electroluminescence device, comprising an anode and a light emitting function layer, wherein the organic electroluminescence device further comprises the conductive film of claim 1, the conductive film is formed as a cathode arranged opposite to the anode, and the light emitting function layer is located between the conductive film and the anode.

6. The organic electroluminescence device of claim 5, wherein the matrix has a thickness in a range from 30 nm to 50 nm.

7. The organic electroluminescence device of claim 6, wherein the conductive metal nano-ions distributed in the matrix comprises Ag and/or Mg, and the matrix has a thickness in a range from 40 nm to 50 nm.

8. The organic electroluminescence device of claim 5, wherein the conductive film has a transmittance to red light in a range from 63% to 69%, a transmittance to green light in a range from 67% to 73%, and a transmittance to blue light in a range from 73% to 77%.

9. The organic electroluminescence device of claim 5, wherein the light emitting function layer comprises an electron transport layer, the conductive film is connected to the electron transport layer, and the electron transport layer is prepared from an aromatic compound having a nitrogen-heterocyclic electron withdrawing group.

10. The organic electroluminescence device of claim 5, wherein the light emitting function layer comprises a first light emitting unit for emitting red light, a second light emitting unit for emitting green light, and a third light emitting unit for emitting blue light,
wherein a distance between a first film portion of the conductive film corresponding to the first light emitting unit and the anode is greater than a distance between a second film portion of the conductive film corresponding to the second light emitting unit and the anode; and
a distance between a second film portion of the conductive film corresponding to the second light emitting unit and the anode is greater than a distance between a third film portion of the conductive film corresponding to the third light emitting unit and the anode.

11. The organic electroluminescence device of claim 5, wherein the conductive film is prepared by an evaporation process or a spin coating process.

12. A display device, comprising the organic electroluminescence device of claim 7.

13. The organic electroluminescence device of claim 5, wherein the matrix is an organic network polymer or an organic porous polymer, and the matrix and the conductive metal nano-ion are chelatedly connected through a coordination bond; or the matrix is an inorganic porous material, and the matrix and the conductive metal nano-ions are coordinately connected through intermolecular force.

14. A method for preparing an electrode material, comprising:

providing conductive metal nano-ions and a monomer material; and preparing an electrode material comprising a matrix and conductive metal nano-ions distributed in the matrix using the monomer material and the conductive metal nano-ions, wherein the matrix is selected from at least one of an organic network polymer, an organic porous polymer, and an inorganic porous material, wherein the matrix in which the conductive metal nano-ions are distributed has a specific surface area greater than 150 $m^2/g$, and wherein the conductive metal nano-ions comprise at least one of Ag, Mg, Au, and Al.

15. The method of claim 14, wherein the monomer material is an organic monomer, and the preparing the electrode material comprising the matrix and the conductive metal nano-ions distributed in the matrix comprises:

making the organic monomer polymerize into an organic network polymer; and chelating the conductive metal nano-ions with an organic network polymer having a preset temperature to prepare the electrode material.

16. The method of claim 15, wherein the chelating the conductive metal nano-ions with the organic network polymer having the preset temperature to prepare the electrode material comprises:

placing the organic network polymer in a preset solvent;

adding the conductive metal nano-ions after the preset solvent is heated to a preset temperature, to chelate the conductive metal nano-ions with the organic network polymer in the preset solvent; and filtering the preset solvent, and vacuum drying the electrode material obtained by filtering the preset solvent, to obtain the electrode material.

17. The method of claim 14, wherein the monomer material is an organic monomer, and the preparing the electrode material comprising the matrix and the conductive metal nano-ions distributed in the matrix comprises:

chelating the conductive metal nano-ions with the organic monomer to obtain a chelated metal; and placing the chelated metal in a preset solvent, and polymerizing the organic monomer in the chelated metal to form an organic network polymer, to obtain the electrode material.

18. The method of claim 17, wherein after placing the chelated metal in the preset solvent, and polymerizing the organic monomer in the chelated metal to form the organic network polymer, the method further comprises:

filtering the preset solvent, and vacuum drying the electrode material obtained by filtering the preset solvent.

\* \* \* \* \*